US008223057B2

(12) United States Patent
Carter et al.

(10) Patent No.: US 8,223,057 B2
(45) Date of Patent: Jul. 17, 2012

(54) QUANTIZING SAMPLED INPUTS USING FIXED FREQUENCY ANALOG TO DIGITAL CONVERSIONS THROUGH INTERPOLATION

(75) Inventors: Ronald W. Carter, Russellville, AR (US); Kurt H. Copley, Smyrna, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 0 days.

(21) Appl. No.: 12/894,856

(22) Filed: Sep. 30, 2010

(65) Prior Publication Data

US 2012/0081153 A1 Apr. 5, 2012

(51) Int. Cl.
*H03M 1/12* (2006.01)
(52) U.S. Cl. .......................................... 341/155; 341/123
(58) Field of Classification Search .................... 341/61, 341/122, 123, 155; 282/300; 348/580
See application file for complete search history.

(56) References Cited

U.S. PATENT DOCUMENTS

| 5,040,192 | A | | 8/1991 | Tjahjadi |
| 5,260,839 | A | * | 11/1993 | Matsuta et al. ............... 386/271 |
| 5,933,467 | A | | 8/1999 | Sehier |
| 5,986,635 | A | * | 11/1999 | Naka et al. .................... 715/716 |
| 6,016,112 | A | | 1/2000 | Knudsen |
| 6,185,508 | B1 | | 2/2001 | Van Doorn et al. |
| 6,631,341 | B2 | * | 10/2003 | Kameda et al. ............... 702/124 |
| 6,687,630 | B2 | | 2/2004 | Dionne |
| 7,245,450 | B1 | | 7/2007 | Cherubini |
| 7,444,249 | B2 | | 10/2008 | Carter |
| 2003/0014203 | A1 | | 1/2003 | Dionne |
| 2004/0260471 | A1 | | 12/2004 | McDermott |
| 2005/0038942 | A1 | | 2/2005 | Swanson |

FOREIGN PATENT DOCUMENTS

| EP | 0601605 A2 | 6/1994 |
| EP | 0810784 A2 | 12/1997 |

OTHER PUBLICATIONS

Written Opinion of the International Searching Authority, International Application No. PCT/US2011/053639, Dated Mar. 15, 2012 (8 pages).
International Search Report, International Application No. PCT/US2011/053639, Dated Mar. 15, 2012 (5 pages).

* cited by examiner

*Primary Examiner* — Brian Young
(74) *Attorney, Agent, or Firm* — Nixon Peabody LLP

(57) ABSTRACT

A system and methods for synchronizing quantized sampled data in a monitoring device. A variable frequency output signal is coupled to an analog to digital converter. A fixed frequency clock is coupled to the analog to digital converter. The analog to digital converter samples the output signal at a fixed frequency to produce high speed samples. A group of initial high speed samples is stored from the analog to digital converter over a fixed window of time. The group of initial high speed samples is interpolated to produce a group of fewer low speed samples from the initial group of high speed samples over the fixed window of time. The group of low speed samples is stored as a representation of the variable frequency output signal.

20 Claims, 6 Drawing Sheets

QUANTIZING SAMPLED INPUTS USING FIXED FREQUENCY ANALOG TO DIGITAL CONVERSIONS THROUGH INTERPOLATION

FIELD OF THE INVENTION

Aspects disclosed herein relate generally to power monitoring systems, and, in particular, to a system to more efficiently process data from voltage and current signals through data obtained on a fixed frequency analog to digital converter via interpolation.

BACKGROUND

Microprocessor-based electrical power systems accumulate considerable amounts of information concerning the electrical distribution systems to which they are connected, as well as the power equipment itself. Today's utility monitoring systems provide end-users with the capability to remotely monitor a variety of equipment via automatic monitoring devices. The spectral information is used when compensating a system to reduce harmonic content and for other troubleshooting purposes.

The typical monitoring device such as a digital power meter utilizes an analog-to-digital (A/D) converter and a microprocessor, and thus all analysis is done in the discrete time or digital domain. The input signals (such as current or voltage) are digitized by the A/D converter operating at a sampling rate which is determined by an adjustable frequency digital clock. In order to sample an integer number of cycles of the signal (assuming the sample rate is held constant during the sampling window), it is necessary that the sample rate and the frequency of the signal be integrally related. The required sample rate is determined by measuring the frequency of the input signal and then multiplying the frequency by some integer such that the Nyquist requirement and other system constraints are met. Because the adjustable sample clock does not have infinite precision, it is not possible to set it to the required frequency for some input frequencies.

The fundamental period of the system voltage may be measured by identifying zero crossings of the waveform of the power signal, and determining the time interval between those zero crossings. The reciprocal of the fundamental period is the measured frequency, and the desired sampling frequency is a multiple of that measured frequency. However, the actual sampling frequency is controlled by an adjustable-frequency digital clock, which is not infinitely variable and cannot be easily controlled with the requisite degree of precision to achieve an actual sampling frequency within the maximum permissible error (e.g., ±0.03%).

There are primarily two methods used to sample the voltages and currents in a power system in order to make power/energy measurements and power quality measurements (harmonics, etc.) One is to operate the analog to digital (A/D) converter at a constant sample rate and window the voltage and current samples so as to mitigate to some extent the effects of non-synchronous sampling. These effects consist primarily of inaccurate RMS values (and thus inaccurate power and energy) and inaccurate harmonic measurements at certain frequencies relative to the sample rate. The other method is to synchronously sample the inputs by using hardware or firmware to control the sampling. The windowing method requires that each sample on each voltage and current channel is multiplied by the window function value at that sample index. This requires significant processor bandwidth and memory capacity especially as the sample rate increases.

Synchronous sampling may be achieved using either hardware or firmware. Controlling the sampling in hardware usually adds cost when compared to the firmware solution unless the load on the processor requires a more expensive processor.

There are two ways to achieve synchronous sampling through the use of firmware. One is for the processor to control the sample rate of the A/D converter. The other is to operate the A/D converter at a constant sample rate and re-sample the data in firmware. For example, hardware control of the sample rate in certain devices is dictated by the use of an A/D converter such as a sigma delta type of A/D converter and the sample clock must operate between approximately 1 and 4 MHz. Thus, it is difficult to obtain high precision control of the clock through firmware.

Using a sigma delta analog to digital converter to provide synchronous sampling proves to be significantly more complex than using successive approximation (SAR) analog to digital converters. Digital clock timers do not allow for infinite sampling interval resolution. The resulting resolution is relatively poor and the error increases depending on the magnitude of the fractional portion of the ratio of the sample frequency to the power frequency. Thus, it would be useful to have an accurate sampling protocol that provides synchronous sampling while efficiently using computing and memory resources.

BRIEF SUMMARY

Tracking small shifts in a system frequency, such as in a power system that supplies alternating current at 60 Hz, is important to ensure that current or voltage measured by monitoring points within the system is synchronized with the frequency shifts. When the data measurements do not track the system frequency, errors can propagate throughout the system, affecting the integrity of further calculations and analysis based on the original data measurements. The present disclosure proposes to do something counter-intuitive—to make the clock frequency of the analog to digital converter fixed and independent of the system frequency. As a result, the sample rate is always fixed. The present disclosure proposes to resample a subset of the data produced at the sample rate by the analog to digital converter using an interpolation algorithm.

According to one example, a method of synchronizing quantized sampled data in a monitoring device to a system frequency is disclosed. A variable frequency output signal in an analog to digital converter sampling at a fixed frequency according to a fixed frequency clock is received. The output signal at the fixed frequency is sampled to produce corresponding high speed samples. A group of initial high speed samples from the analog to digital converter over a predetermined period of time is temporarily stored. The group of initial high speed samples is interpolated to produce a group of fewer low speed samples from the initial group of high speed samples over the predetermined period of time. The group of low speed samples is stored as a representation of the variable frequency output signal.

Another example is a system for efficient sampling of variable frequency data measured by a monitoring device. The system includes a fixed frequency clock and an analog to digital converter coupled to the fixed frequency clock. The analog to digital converter samples a variable frequency output signal received by the monitoring device at a fixed frequency determined by the fixed frequency clock. A controller is coupled to a digital output of the analog to digital converter. The controller derives a group of initial high speed sample points from samples obtained by the analog to digital converter from the variable frequency output signal over a predetermined period of time. The controller generates a group of low speed sample points from the initial group of high speed sample points. The group of low speed sample points is less than the group of high speed sample points and is generated by interpolating between the group of high speed sample points.

Another example is a non-transitory, machine-readable medium having stored instructions for synchronizing quantized sampled data in a monitoring device. The monitoring device includes an analog to digital converter sampling a variable frequency output signal at a fixed frequency. The medium includes machine executable code which when executed by at least one machine, causes the machine to store a group of initial high speed samples from the analog to digital converter over a predetermined period of time. The code causes the machine to interpolate the group of initial high speed samples to produce a group of fewer low speed samples from the initial group high speed samples over the fixed window of time. The code causes the machine to store the group of low speed samples as a representation of the variable frequency output signal.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
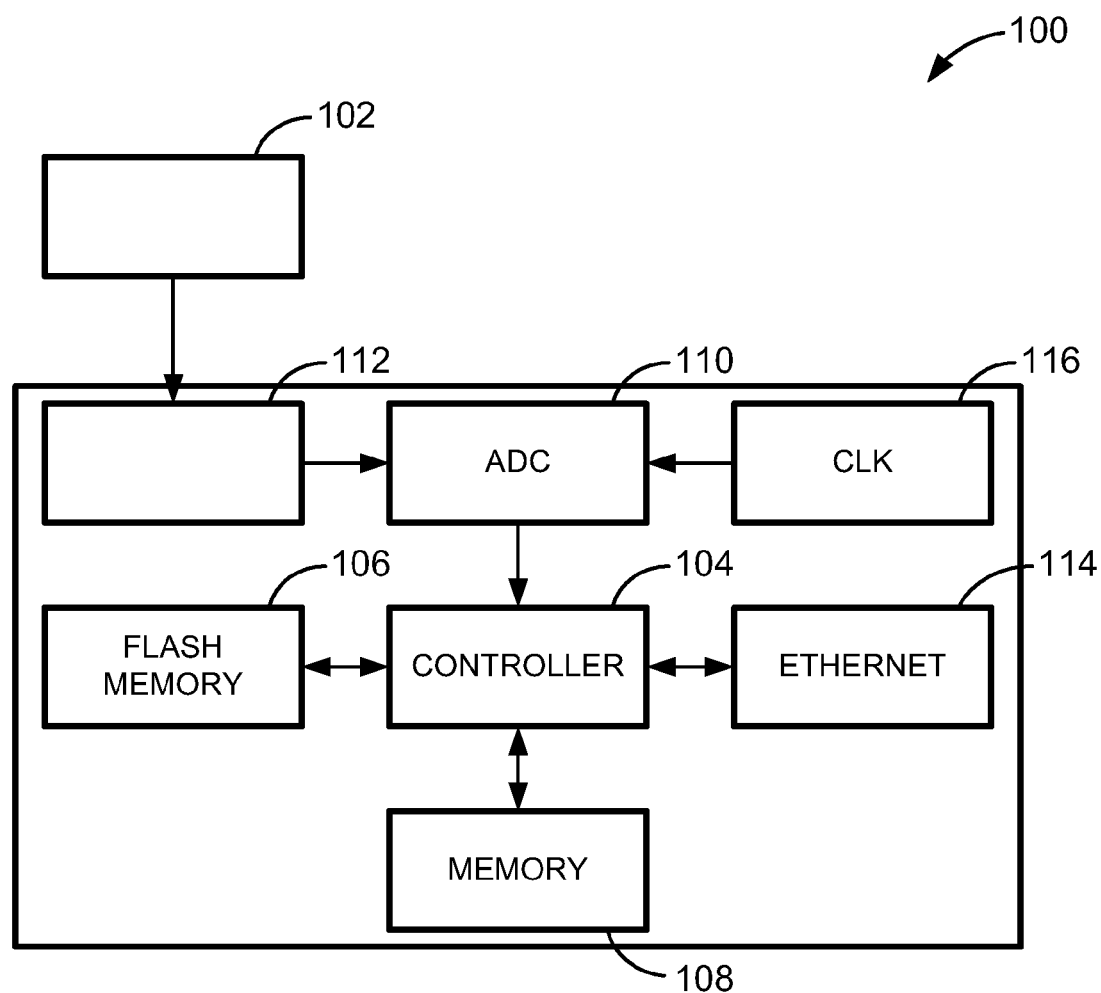
FIG. 1 is a functional block diagram of a monitoring device using an analog to digital converter driven by a fixed frequency clock.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 shows a monitoring device 100 which is a meter used to measure electrical characteristics in an electrical system 102. In this example, the monitoring device 100 may be a power meter or a circuit monitor. The electrical system 102 in this example is a utility system being monitored by the monitoring device 100 may be any of the five utilities designated by the acronym, WAGES, or water, air, gas, electricity, or steam in this example. The measured characteristics, which may include current, voltage, frequency, power, energy, volume per minute, volume, temperature, pressure, flow rate, or other characteristics of water, air, gas, electricity, or steam utilities, are recorded as output data relating to such measurements. The device 100 may be capable of storing data in onboard memory and is capable of communicating with a data collection system via a network to transmit measured characteristics to the data collection system for display, storage, reporting, alarming, and other functions.

The monitoring device 100 measures characteristics of the utility such as voltage signals, and quantifies these characteristics into data that can be further analyzed by software. In the electrical context, the monitoring device 100 may be a PowerLogic® Series 3000/4000 Circuit Monitor or a PowerLogic® ION7550/7650 Power and Energy Meter, or PM5xxx series meter available from Schneider Electric or any other suitable monitoring device such as an intelligent electronic device (IED), a metering device, or a power meter.

The monitoring device 100 includes a controller 104, a flash memory 106, a DRAM memory 108, an analog to digital converter (ADC) 110, an input port 112, an Ethernet interface 114, and a clock 116. The Ethernet interface 114 has one or more on-board Ethernet ports, e.g., one for a 10/100Base TX Twisted Pair connection and another for a 100Base Fx connection. The Ethernet interface 114 may be coupled to a network for transmission of measured data from the monitoring device 100. Similarly, data from the monitoring points of a system such as an electrical system 102 in FIG. 1 may be coupled to a line coupled to input port 112. In this example, the monitoring points are the measured magnitude of a variable frequency electrical output signal.

The controller 104 in FIG. 1 collects, stores, and distributes data (i.e., indicative of the utility characteristics) recorded by the monitoring device 100 from the input port 112. Different operating instructions are burned into the flash memory 106 to operate the controller 104. The collected data derived from the electrical output signal, such as measured current or voltage values, may be stored in buffers and registers in the memory 108 and accessed by the user via the interface 114.

The analog to digital converter (ADC) 110 converts the sampled output signal measured from a power signal from the analog domain to the digital domain, i.e., a signal represented by continuous quantities such as current or voltage is converted to signals represented by a sequence of numbers. In this example the analog to digital converter 110 is an MCP3909 sigma delta type analog to digital converter. Thus, the A/D converter 110 supplies the controller 104 with a series of original samples $OS(1)$, $OS(2)$, $OS(3)$ . . . $OS(m)$, at a known sampling frequency (rate) fs. The clock 116 is coupled to the analog to digital converter 110. The clock 116 is run at a constant or fixed frequency and thus the sampling frequency of the analog to digital converter 110 is fixed based on the frequency of the clock 116. Each group of samples is taken during a fixed predetermined period of time by the analog to digital converter 110.

In this example, the controller 104 creates a low speed sample index of a group of low speed samples from a group of high speed data samples which are initially obtained from the analog to digital converter 110 in FIG. 1. There are fewer low speed samples than the initial high speed samples with the predetermined period of time. The low speed sample index retains accuracy as a representation of the output signal for signal analysis, but does not require as many computing resources and memory space as analysis and processing of the high speed data samples requires.

Linear interpolation is used to determine the sample values when the points of the desired low-speed sample index do not coincide exactly with the corresponding points of the high-speed index. The process of linear interpolation may be performed, for example, according to U.S. Pat. No. 7,444,249 hereby incorporated by reference. When an interpolated low speed sample value is desired, it will fall at a time between the times of two high speed samples during the predetermined period of time. The times are determined by comparing the times the high speed samples are read by the analog to digital converter 110 based on the fixed sampling frequency and the measured frequency of the variable frequency output signal which divides the predetermined period of time into intervals between the desired number of low speed samples. Any given low speed sample may fall between the times of two high speed samples and interpolation is used to determine the value of the low speed sample. The difference between the value of the first high speed sample and the value of the second high speed sample is multiplied by a fractional value reflecting the fractional time between the times of the two high speed samples that the low speed sample occurs. This result is then added to the value of the first high speed sample to obtain an interpolated value which is stored as the value of the low speed sample by the controller 104.

Based on simulation results, the linear interpolation provides a good tradeoff between accuracy and processor overhead for establishing the low speed index. The terms high-speed and low-speed refer to the actual input sample rate and the decimated rate respectively. The high speed samples are temporarily stored and discarded after they have been used for interpolation to determine the low speed samples thereby saving memory. Only a subset of the high speed samples sufficient to obtain one low speed sample value are temporarily stored in memory for a given time period. Since only the smaller number of low speed sample value are stored, the discarding of most of the high speed values maximizes memory efficiency.

In this example, the input high speed sample rate is assumed to be 3.58 MHz/256 (13.984 KHz) which is the output data rate for the example analog to digital converter 110. In this example, the MCP3909 model analog to digital converter is run by a fixed-frequency clock such as the clock 116 at a fixed frequency of 3.58 MHz, which is the clock frequency that is specified for the performance specifications of the MCP3909 model analog to digital converter. A sample is thus taken every 256 clock cycles. Of course other types of analog to digital converters operating at different fixed clock frequencies may be used. With this clock rate, the number of high speed samples per cycle at the input of the analog to digital converter 110 is 279.7 for a 50 Hz frequency input signal and 233.1 for a 60 Hz frequency input signal. The rate after decimation may be 32, 64 or 128 low speed samples per cycle based on the desired performance and processor overhead.

Figure 2:
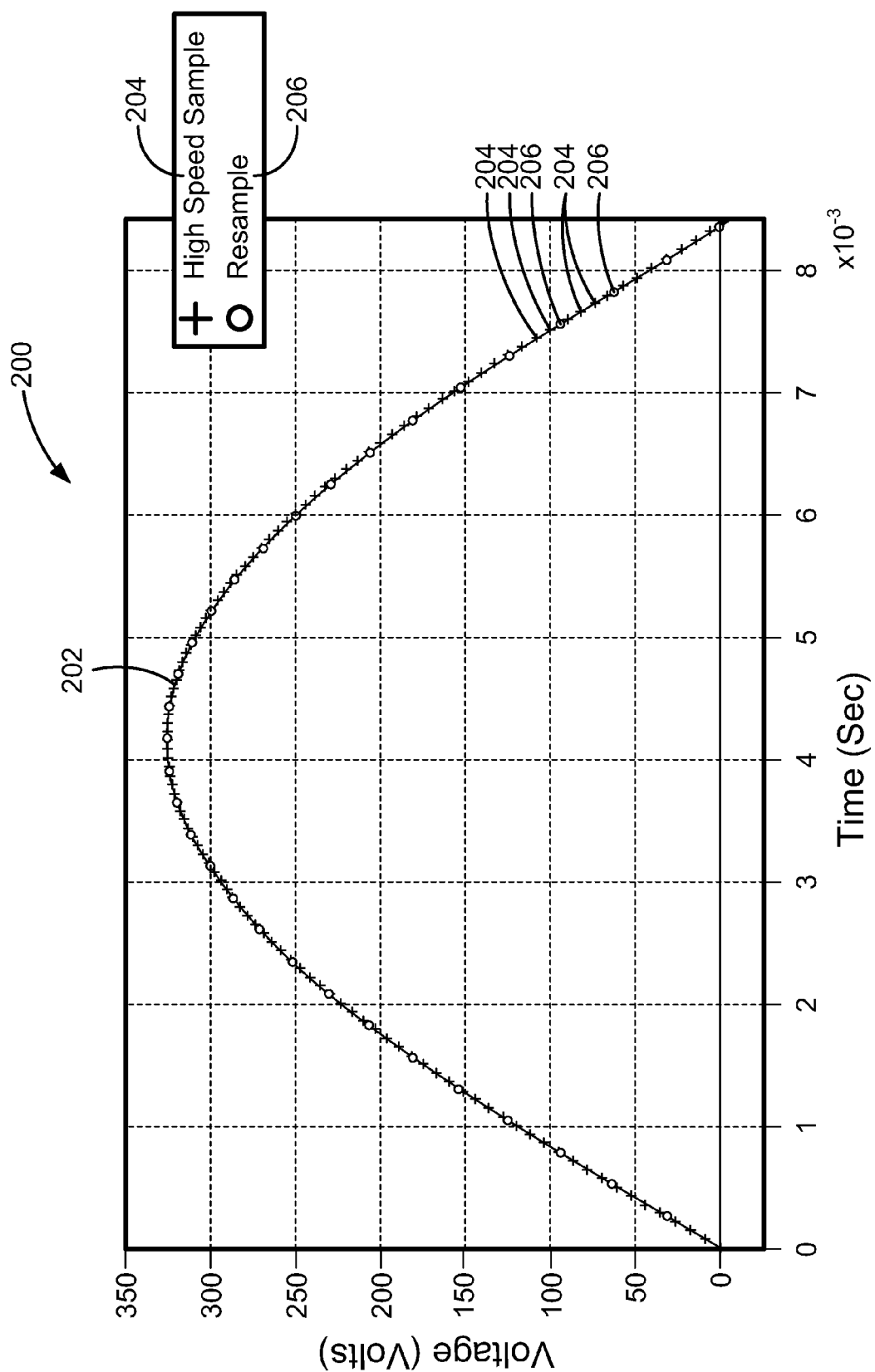
FIG. 2 is a graph showing the higher sampling rate and the interpolated lower sampling rate data points used by the monitoring device in FIG. 1.

FIG. 2 is a voltage plot 200 of an example of the data outputs and inputs for a re-sampling algorithm applied to a received variable frequency voltage signal 202 which is currently at a frequency of 60 Hz for a low-speed sample rate of 64 samples per cycle. FIG. 2 shows a number of high speed samples shown as a symbol 204. As shown by the symbols 204, the analog to digital converter 110 takes high speed samples 233 times per cycle in this example. FIG. 2 also includes a number of resampled values at the low-speed sample rate represented by a symbol 206. The resampled low speed values 206 consist of 64 samples per cycle. The resampled low speed values 206 are interpolated from the closest sampled high speed values 204 as will be described below. The high speed values 204 are taken at a fixed frequency depending on the clock rate of the clock 116 coupled to the analog to digital converter 110 in FIG. 1. The frequency of the input signal may change and is determined by the controller 104 in FIG. 1 periodically in order to determine the increments of high speed samples to determine each of the low speed samples.

The algorithm to obtain the low speed sample values greatly simplifies the hardware design for the use of sigma delta analog to digital converters such as the analog to digital converter 110 since a variable sampling frequency does not have to be employed. The interpolation to obtain lower speed values provides sampling that is effectively synchronous with the power system and therefore output signal frequency. Synchronous sampling is important for reducing spectral leakage. The algorithm provides finer resolution for the system frequency tracking. Better frequency resolution improves RMS (root means squared), THD/thd (total harmonic distortion) and harmonic identification accuracies.

The controller 104 in FIG. 1 may be conveniently implemented using one or more general purpose computer systems, general processors, microprocessors, digital signal processors, micro-controllers, fixed hardware devices such as application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein. The controllers may also be implemented on a computer system or systems that extend across any network environment using any suitable interface mechanisms and communications technologies including, for example telecommunications in any suitable form (e.g., voice, modem, and the like), Public Switched Telephone Network (PSTNs), Packet Data Networks (PDNs), the Internet, intranets, a combination thereof, and the like.

Figure 3A:
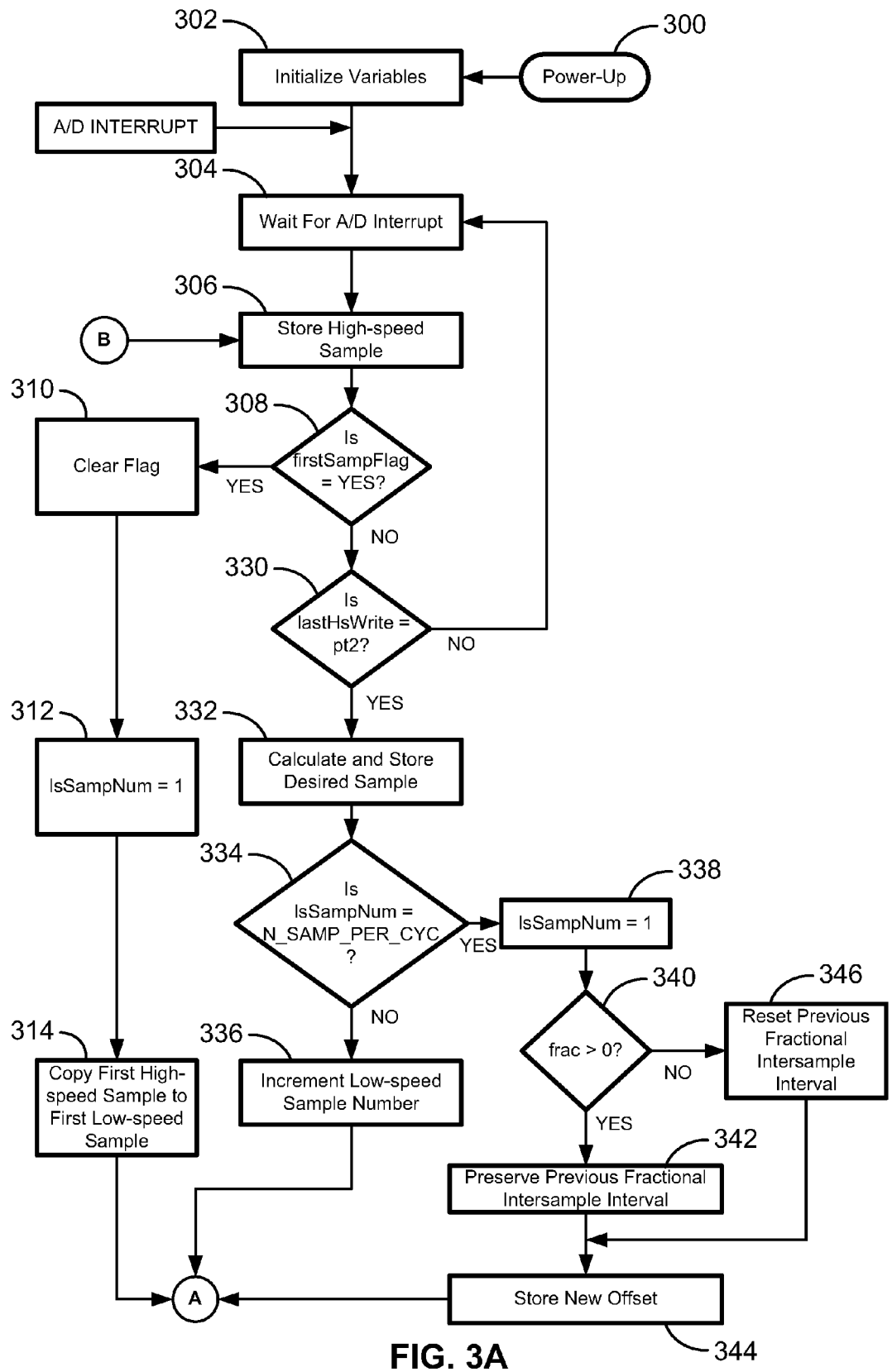
FIGS. 3A-3B are a flow diagram of an exemplary algorithm for interpolation of data points from data points obtained from a fixed clock, analog to digital converter according to the aspects disclosed herein.
Figure 3B:
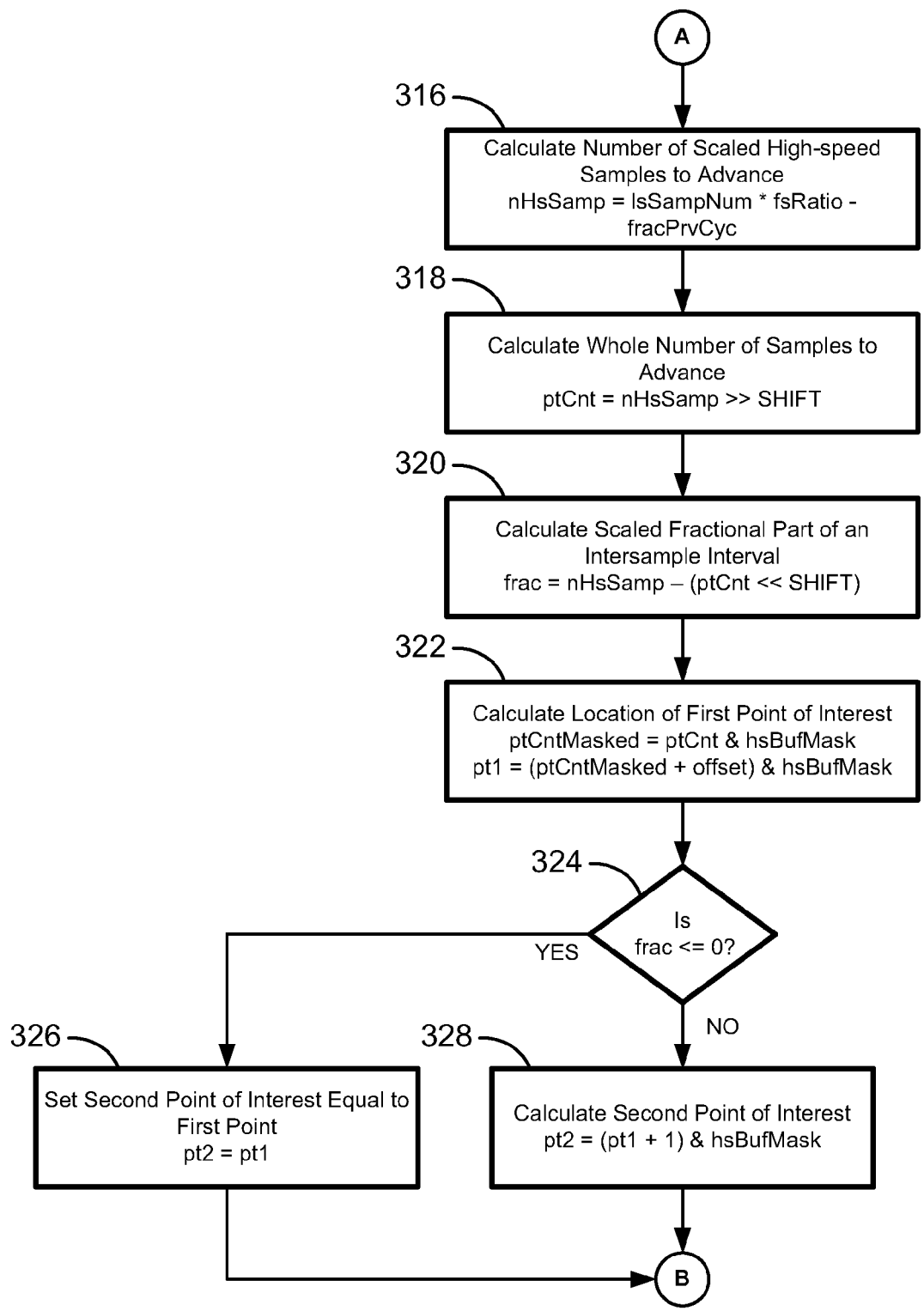
Figure 4A:
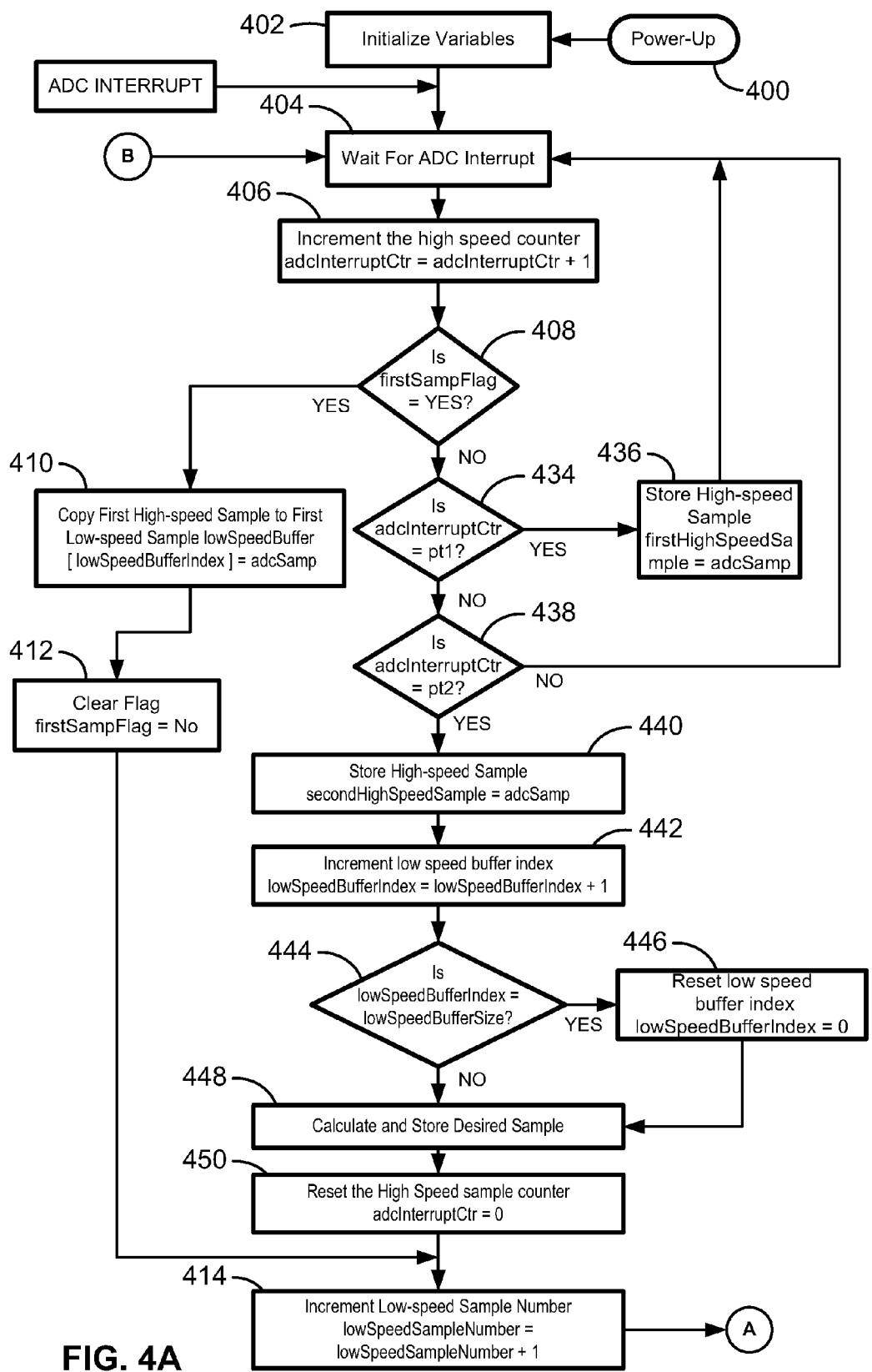
FIGS. 4A-4B are a flow diagram of another exemplary algorithm for interpolation of data points from data points obtained from a fixed clock, analog to digital converter according to the aspects disclosed herein.
Figure 4B:
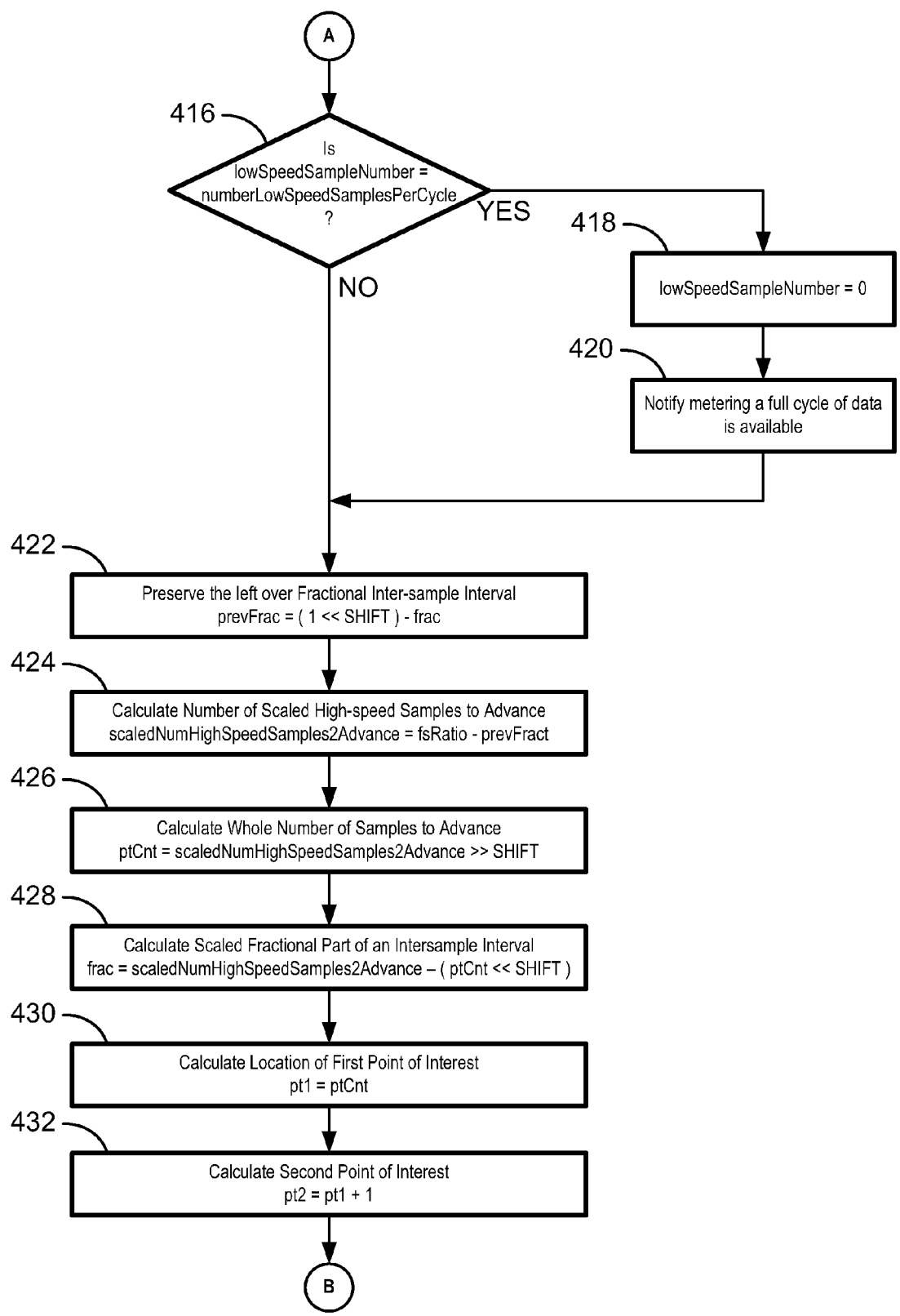

The operation of the example re-sampling sequence, will now be described with reference to FIG. 1 in conjunction with the flow diagrams shown in FIGS. 3A-3B and alternatively in the flow diagram shown in FIGS. 4A-4B. The flow diagrams in FIGS. 3A-3B and 4A-4B are representative of example machine readable instructions for low speed sampling from samples obtained at a fixed frequency for an analog to digital converter. In this example, the machine readable instructions comprise an algorithm for execution by: (a) a processor, (b) a controller, and/or (c) one or more other suitable processing device(s). The algorithm may be embodied in software stored on a non-transitory, machine-readable medium media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). The medium stores the software which includes machine executable code which when executed by at least one machine performs some or all of the processes described below. For example, any or all of the components of the re-sampling sequence could be implemented by software, hardware, and/or firmware. Also, some or all of the machine readable instructions represented by the flowchart of FIGS. 3A-3B or FIGS. 4A-4B may be implemented manually. Further, although the example algorithm is described with reference to the flowcharts illustrated in FIGS. 3A-3B and FIGS. 4A-4B, persons of ordinary skill in the art will readily appreciate that many other methods of implementing the example machine readable instructions may alternatively be used. For example, the order of execution of the blocks may be changed, and/or some of the blocks described may be changed, eliminated, or combined.

FIGS. 3A-3B show the process performed by an algorithm to convert high speed fixed frequency samples to a smaller group of low speed samples for a single channel of the analog to digital converter. The process is identical for all channels of data received from the analog to digital converter. The algorithm is run on the controller 104 in FIG. 1. The controller 104 is initially powered up and the analog to digital converter 110 is put on line to sample voltage and current signals from the electrical system 102 (300). The variables required by the algorithm stored in the memory 106 are initialized by the controller 104 (302). In this example the variables include a last high speed write field, a high speed buffer mask field, a last low speed write field, a low speed buffer mask field, a first sample flag, an offset value, a fraction value and a fraction of previous cycle value. The high speed write field holds a pointer to the samples obtained from the analog to digital converter 110 and the low speed write field holds a pointer to the interpolated low speed samples. The buffer mask fields include the number of points that are stored in buffers. In this example, sixteen high speed values are stored while 128 points are stored for the low speed values. The first sample flag is a Boolean value indicating whether the sample is the first sample after power up. The offset value is the location in the high speed buffer of the last high speed sample used in interpolation for the previous cycle. It is set equal to pt2 at the end of a cycle. The fraction value is the fraction of time between high speed sample points that a low speed sample is taken. In this example, the last high speed write field points to the value in the last slot in the high speed buffer. The fraction and offset and previous cycle fraction are initialized at zero. The first sample flag is set at YES.

An analog to digital converter interrupt is received by the controller 104 from the analog to digital converter 110 indicating a read high speed sample (304). The high speed sample from the analog to digital converter 110 is stored in the memory 108 in one of the buffers of high speed samples (306). If the first sample flag field is set to YES (308), then the flag is cleared and set to NO (310). The sample number is set to one (312). The first high speed sample is copied the first low-sample field (314). The number of scaled high speed samples to advance is calculated (316). The number of scaled high speed samples is determined by the number of samples multiplied by the ratio of high speed to low speed sample rates minus the fraction of the previous cycle. The ratio of high speed to low speed sample rates is determined from the measured line frequency and the fixed frequency at which the analog to digital converter 110 operates. The measured line frequency is determined by the controller 104 via conventional means. The operating firmware stored on the flash memory 106 measures the line frequency as often as required to produce the desired performance in terms of power error and harmonic measurements for the signal monitored by the monitoring device 100. The ratio of high speed to low speed sample rates is reset every time a new line frequency is determined.

The whole number of samples required to advance is determined by the controller 104 (318). The fractional part of the inter-sample interval is calculated based on the whole number of samples and the number of scaled high speed samples (320). The location of the first point of interest in the high speed buffer is calculated from the number of samples to advance added to the offset and the result logically ANDed with the high speed buffer mask (322). The controller 104 determines whether the fraction value is less than or equal to zero (324). If the fraction value is less than or equal to zero, the desired low speed sample coincides in time with a high speed sample and thus the two high speed points are one and the same (and no interpolation is required) (326). If the fraction is greater than zero (324), the second point of interest is the next sample after the first point (328). The algorithm returns to wait for the next interrupt from the analog to digital converter 110 (304).

If the first sample flag is NO (308), the algorithm determines whether the last high speed write is at the second point (330). If the last high speed write is not at the second point, the algorithm returns and waits for the next interrupt from the analog to digital converter 110 (304).

If the last high speed value is at the second point (330), the desired low speed sample is calculated by multiplying the fractional value by the difference between the sample value at point 2 and the sample value at point 1. The result is then added to the value of the sample at point 1 to get the low speed value which lies between the high speed samples at points 1 and 2 The controller 104 determines whether the location of the sample is the last sample of the cycle (334). If the sample is not the last sample in the cycle, the sample number is incremented by one (336). The algorithm then proceeds to calculate the number of scaled high speed samples (316).

If the sample number is the last sample in the cycle (334), the sample number is set to one (338), and it is determined whether the fraction is greater than zero (340). If the fraction is greater than zero (340), the previous fraction cycle is set to 1 minus the fraction (342). The new offset is stored by setting the offset to the second point (344). The algorithm proceeds to calculate the number of scaled high speed samples (316). If the fraction is not greater than zero (340), the previous fraction interval is reset to zero (346) and the new offset is stored by setting the offset to the second point (344).

FIGS. 4A-4B are another flow diagram of an alternate algorithm performed by the controller 104 in FIG. 1 to convert high speed fixed frequency samples to a smaller group of low speed samples for a single channel of the analog to digital converter. The controller 104 is initially powered up and the analog to digital converter 110 is put on line with the input port 112 to sample voltage and current signals from the electrical system 102 (400). The variables required by the algorithm stored in the memory 108 are initialized by the controller 104 (402). In this example the variables include a lowSpeedBufferIndex variable which is the index management for the low speed buffer, a lowSpeedSampleNumber variable which is a counter of low speed samples used to indicate a complete cycle has been interpolated, an adcInterruptCtr variable (a counter indicating the number of times the high speed interrupt runs which is the high speed sample count), a firstSampFlag variable which indicates that the sample is the very first sample and does not need to be interpolated and serves as the starting place, a frac variable which is the fractional amount of time between the high speed samples where the low speed point occurs, and a prevFrac variable which is the amount of time between the last interpolated low speed point and the following high speed point. In the initialization phase (402), the above variables are set to zero except the firstSampFlag variable which is set to YES.

An analog to digital converter interrupt is received by the controller 104 from the analog to digital converter 110 indicating a read high speed sample (404). The high speed counter variable, adcInterruptCtr, is incremented by one (406). If the first sample flag variable is set to YES (408), then the first high speed sample is copied to the first low-sample field (410). The first sample flag is set to NO (412). The lowSpeedSampleNumber variable is incremented by one (414).

The value of the lowSpeedSampleNumber variable is compared to the number of low speed samples per cycle used for measurements (416). In this example, the number of low speed samples per cycle is 32. If the number of low speed samples is the same as the number of low speed samples per cycle (416), the lowSpeedSampleNumber variable is reset to zero (418). The monitoring device 100 is then notified that a full cycle of low speed sampled data is available (420) for processing and the algorithm proceeds to block 422.

If the value of the lowSpeedSampleNumber variable is not equal to the number of low speed samples per cycle (416), the algorithm preserves the left over fractional inter-sample interval (422). Preserving the left over fractional inter-sample interval sets the variable, prevFrac to one minus the fractional amount of time between the high speed samples where the low speed sample point occurs (424). This calculation is performed in the SHIFT which is the number of bits to shift the integers to maintain resolution in the integer calculations. In this example this number of bits is 22. The number of scaled high speed samples to advance is calculated by subtracting the left over fractional inter-sample interval from the ratio of high-speed to low-speed sample rates (424). The ratio of high speed to low speed sample rates is determined each time the frequency of the signal is measured. The measured frequency of the measured signal is determined by the controller 104 by conventional means. The operating firmware stored on the flash memory 106 measures the line frequency as often as required to produce the desired performance in terms of power error and harmonic measurements for the voltage signal monitored by the monitoring device 100.

The whole number of samples required to advance in order to get the ADC sample required for interpolation is determined by the controller 104 (426). The scaled fractional part of the inter-sample interval is calculated based on the whole number of samples subtracted from the number of scaled high speed samples (428). The location of the first point of interest when the first high speed sample must be collected is then determined as the non-scaled number of high speed samples to advance in order to get the ADC sample required for the interpolation (430). The location of the second point of interest where the second high speed sample must be collected is then determined (432). The algorithm returns to wait for the next interrupt from the analog to digital converter 110 (404).

If the first sample flag is NO (408), the algorithm determines whether the value of the adcInterruptCtr variable is at the first point of interest (434). If the interrupt counter value is at the first point of interest (434), the high speed sample is stored in the first high speed sample field (436) and the algorithm loops back to wait for the next interrupt from the analog to digital converter 110 (404). If the counter is not at the first point of interest (434), the algorithm determines whether the value of the adcInterruptCtr variable is at the second point of interest (438). If the variable is not at the second point of interest (438), the algorithm loops back to wait for the next interrupt from the analog to digital converter 110 (404).

If the counter is at the second point of interest (438), the high speed sample is stored in the sample field (440). The low speed buffer index is incremented by one (442). The algorithm determines whether the value of the low speed buffer index has reached the low speed buffer size (444). The low speed buffer size is the amount of memory the device has set aside for the algorithm to store the calculated low speed samples from the high speed samples. In this example, the low speed buffer size is 128 data entries. If the low speed buffer index has reached the low speed buffer size (444), the low speed buffer index is reset to zero (446) and the algorithm proceeds to block 448.

If the low speed buffer index has not reached the low speed buffer size (444), the algorithm calculates and stores the desired sample (448). The calculation interpolates the first and second high speed samples of the points of interest by multiplying the difference between the two values by fractional amount of time between the high speed samples where the low speed sample is taken. This amount is added to the value of the low speed sample and stored in the low speed buffer. The high speed sample counter variable, adcInterruptCtr, is reset to zero (450) and the algorithm proceeds to increment the low speed sample number (414).

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of synchronizing quantized sampled data in a monitoring device to a system frequency, the method comprising:
    receiving a variable frequency output signal in an analog to digital converter sampling at a fixed frequency according to a fixed frequency clock;
    sampling the variable frequency output signal at the fixed frequency according to the fixed frequency clock to produce corresponding high speed samples;
    temporarily storing a group of initial high speed samples obtained from the analog to digital converter over a predetermined period of time;
    interpolating the group of initial high speed samples to produce a group of fewer low speed samples from the group of initial high speed samples over the predetermined period of time via a controller; and
    storing the group of low speed samples as a representation of the variable frequency output signal.

2. The method of claim 1, further comprising analyzing the stored low speed samples for a data function related to the output signal.

3. The method of claim 1, wherein the interpolating is performed via instructions on a digital signal processor.

4. The method of claim 1, wherein the interpolating is performed via a fixed hardware device.

5. The method of claim 1, further comprising measuring the frequency of the output signal, the predetermined period of time being determined based on the measured frequency.

6. The method of claim 1, wherein the number of low speed samples in the group of low speed samples is a predetermined number of samples for the predetermined period of time.

7. The method of claim 1, further comprising discarding the group of high speed samples after the interpolation.

8. The method of claim 1 wherein the output signal is from a power system and the variable frequency output signal has voltage or current characteristics.

9. The method of claim 1 wherein the interpolation is performed by determining the time of a low speed sample relative to two high speed samples, determining the fraction of time the low speed sample occurs between the time between the two high speed samples, multiplying the fraction by the difference in the values of the two high speed samples and adding the result to the first high speed value to obtain the value of the low speed sample.

10. A system for efficient sampling of variable frequency data measured by a monitoring device, the system comprising:
 a fixed frequency clock;
 an analog to digital converter coupled to the fixed frequency clock and sampling a variable frequency output signal received by the monitoring device at a fixed frequency determined by the fixed frequency clock; and
 a controller coupled to a digital output of the analog to digital converter, the controller deriving a group of initial high speed sample points from samples obtained by the analog to digital converter from the variable frequency output signal over a predetermined period of time, generating a group of low speed sample points from the initial group of high speed sample points, the group of low speed sample points being less than the group of high speed sample points and the group of low speed sample points being generated by interpolating between the group of high speed sample points.

11. The system of claim 10 wherein the controller analyzes the low speed sample points for a data function related to the output signal.

12. The system of claim 10, wherein the controller is a digital signal processor.

13. The system of claim 10, wherein the controller is a fixed hardware device.

14. The system of claim 10, wherein the controller measures the frequency of the output signal and sets the predetermined period of time based on the measured frequency.

15. The system of claim 10, wherein the number of low speed sample points in the group of low speed sample points is a predetermined number of sample points for the predetermined period of time.

16. The system of claim 10, further comprising a memory, the controller storing the group of low speed sample points in the memory, temporarily storing a subset of the group of high speed sample points in the memory to perform the interpolation and discarding the subset of high speed sample points from memory after the interpolation.

17. The system of claim 10 wherein the output signal is from a power system and the variable frequency output signal has voltage or current characteristics.

18. The system of claim 10 wherein the interpolating includes determining the time of a low speed sample point relative to two high speed sample points, determining the fraction of time the low speed sample point occurs between the time between the two high speed sample points, multiplying the fraction by the difference in the values of the two high speed sample points and adding the result to the first high speed value to obtain the value of the low speed sample point.

19. A non-transitory, machine-readable medium having stored thereon instructions for synchronizing quantized sampled data in a monitoring device including an analog to digital converter sampling a variable frequency output signal at a fixed frequency, comprising machine executable code which when executed by at least one machine, causes the machine to:
 store a group of initial high speed samples from the analog to digital converter over a predetermined period of time;
 interpolate the group of initial high speed samples to produce a group of fewer low speed samples from the initial group high speed samples over the predetermined period of time; and
 store the group of low speed samples as a representation of the variable frequency output signal.

20. The machine-readable medium of claim 19, wherein the executable code further causes the machine to discard the group of high speed samples after the interpolation.

* * * * *